United States Patent
Yeh

(10) Patent No.: US 9,830,077 B2
(45) Date of Patent: Nov. 28, 2017

(54) DATA WRITING METHOD, MEMORY CONTROL CIRCUIT UNIT AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 290 days.

(21) Appl. No.: 14/751,147

(22) Filed: Jun. 26, 2015

(65) Prior Publication Data

US 2016/0320973 A1    Nov. 3, 2016

(30) Foreign Application Priority Data

Apr. 30, 2015  (TW) .............. 104113925 A

(51) Int. Cl.
    *G06F 12/00* (2006.01)
    *G06F 3/06* (2006.01)

(52) U.S. Cl.
    CPC .......... *G06F 3/0604* (2013.01); *G06F 3/0647* (2013.01); *G06F 3/0652* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 9,001,585 | B1 | 4/2015 | Lin et al. |
| 2008/0279005 | A1* | 11/2008 | France ............... G06F 12/0246 365/185.11 |
| 2013/0007355 | A1* | 1/2013 | Radke .................. G11C 11/5628 711/103 |
| 2013/0024609 | A1* | 1/2013 | Gorobets ............ G06F 12/0246 711/103 |
| 2013/0173844 | A1* | 7/2013 | Chen .................... G06F 12/0246 711/103 |

FOREIGN PATENT DOCUMENTS

TW      201441816      11/2014

OTHER PUBLICATIONS

"Office Action of Taiwan Counterpart Application", dated Jul. 22, 2016, p. 1-p. 6.

* cited by examiner

*Primary Examiner* — Prasith Thammavong
*Assistant Examiner* — Jason Blust
(74) *Attorney, Agent, or Firm* — JCIPRNET

(57) ABSTRACT

A data writing method for a rewritable non-volatile memory module, and a memory control circuit unit and a memory storage apparatus using the same are provided. The method includes grouping physical erasing units of the rewritable non-volatile memory module into a temporary area and a storage area. The method also includes selecting a first physical erasing unit from the temporary area, copying a plurality of valid data of the first physical erasing unit to a second physical erasing unit of the temporary area, and performing an erasing operation on the first physical erasing unit. The method further includes selecting a third physical erasing unit from the temporary area, copying a plurality of valid data of the third physical erasing unit to a forth physical erasing unit of the storage area, and performing the erasing operation on the third physical erasing unit.

10 Claims, 13 Drawing Sheets

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

DATA WRITING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 104113925, filed on Apr. 30, 2015. The entirety of the above-mentioned patent application is hereby incorporated by reference herein and made a part of this specification.

BACKGROUND

Technical Field

The present invention relates to a data writing method, and more particularly, to a data writing method for a rewritable non-volatile memory module, a memory control circuit unit and a memory storage apparatus using the same.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as laptop computer due to its data non-volatility, low power consumption, small volume, non-mechanical structure and high read/write speed. A solid state drive (SSD) is a memory storage apparatus which utilizes a flash memory as its storage medium. For these reasons, the flash memory has become an import part of the electronic industries.

Based on memorable bits of each memory cell, a NAND-type flash memory may be classified into a Single Level Cell (SLC) NAND-type flash memory, a Multi Level Cell (MLC) NAND-type flash memory and a Trinary Level Cell (TLC) NAND-type flash memory. Therein, each memory cell of the SLC NAND-type flash memory is capable of storing one bit data (i.e., "1" and "0"), each memory cell of the MLC NAND-type flash memory is capable of storing two bits data, and each memory cell of the TLC NAND-type flash memory is capable of storing three bits data.

In the NAND-type flash memory, physical programming units are constituted by a plurality of memory cells arranged in the same word line. Because each memory cell of the SLC NAND-type flash memory is capable of storing one bit of data, the memory cells arranged on the same word line are corresponding to one physical programming unit in the SLC NAND-type flash memory.

In comparison with the SLC NAND-type flash memory, a floating gate storage layer of each memory cell of the MLC NAND-type flash memory is capable of storing two bits data. Therein, each storage state (i.e., "11", "10", "01" and "00") includes a LSB (Least Significant Bit) and a MSB (Most Significant Bit). For instance, in the storage state, a value of a first bit counted from the left is the LSB, and a value of a second bit counted from the left is the MSB. Accordingly, the memory cells arranged on the same word line can constitute two physical programming units. Herein, the physical programming units constituted by the LSBs of said memory cells are known as a lower physical programming unit, and the physical programming units constituted by the MSBs of said memory cells are known as an upper physical programming unit. Particularly, a writing speed of the lower physical programming unit is faster than a writing speed of the upper physical programming unit, and data stored in the lower physical programming unit may be lost due to errors occurred while programming the upper physical programming unit.

Similarly, each memory cell in the TLC NAND-type flash memory is capable of storing three bits data, wherein each storage state (i.e., "111", "110", "101", "100", "011", "010", "001" and "000") includes a first bit counted from the left being the LSB, a second bit counted from the left being a CSB (Center Significant Bit) and a third bit counted from the left being the MSB. Accordingly, the memory cells arranged on the same word line can constitute three physical programming units. Herein, the physical programming units constituted by the LSBs of said memory cells are known as the lower physical programming unit, the physical programming units constituted by the CSBs of said memory cells are known as a center physical programming unit, and the physical programming units constituted by the MSBs of said memory cells are known as the upper physical programming unit. Particularly, while programming memory cells arranged on the same word line, the stored data may be lost unless only the lower physical programming unit is programmed or all of the lower physical programming unit, the center physical programming unit and the upper physical programming unit are simultaneously programmed.

Generally, in order to prolong an operating life time of the TLC NAND-type flash memory module, a part of physical erasing units therein is programmed in a single-page mode (which only operates in the lower physical programming unit) for simulating operations of the SLC NAND-type flash memory. By doing so, the speed for writing and reading may also be improved since only the lower physical programming units are operated. The part of physical erasing units simulating the operation mode of the SLC NAND-type flash memory may be used to serve as a temporary area of the memory module, which is configured to temporarily store data or store system data. However, in comparison with the physical erasing units operated in the single-page mode, the operating life of the physical erasing units operated in the multi-page mode is relatively shorter, a threshold of a writing or erasing count of the physical erasing units operated in the multi-page mode is lower than a threshold of a writing or erasing count of the physical erasing units operated in the single-page mode, and the speed of the writing or erasing count of the physical erasing units operated in the multi-page mode is slower than the speed of the writing or erasing count of the physical erasing units operated in the single-page mode.

Based on the above, it is one of the major subjects in the industry as how to avoid rapid decline in the operating life of the physical erasing unit operated by using the multi-page mode while improving reliability and access speed of the flash memory having each memory cell capable of storing multiple bits.

Nothing herein may be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data writing method, a memory control circuit unit and a memory storage apparatus, which are capable of effectively extending the operating life and improving the speed of accessing data for the flash memory.

The present invention provides a data writing method adapted for a rewritable non-volatile memory module, the rewritable non-volatile memory module has a plurality of physical erasing units, and each of the physical erasing units has a plurality of physical programming units. The data writing method includes at least grouping the physical erasing units into a temporary area and a storage area, wherein the physical erasing units of the temporary area are operated in a single-page mode for writing data and the physical erasing units of the storage area are operated in a multi-page mode for writing data. The data writing method also includes selecting a first physical erasing unit from among the physical erasing units of the temporary area, copying a plurality of valid data in the first physical erasing unit to a second physical erasing unit among the physical erasing units of the temporary area, and performing an erasing operation on the first physical erasing unit. The data writing method further includes selecting a third physical erasing unit from among the physical erasing units of the temporary area, copying a plurality of valid data in the third physical erasing unit to a fourth physical erasing unit among the physical erasing units of the storage area, and performing the erasing operation on the third physical erasing unit.

An exemplary embodiment of the invention provides a memory control circuit unit for controlling a rewritable non-volatile memory module, wherein the rewritable non-volatile memory module has a plurality of physical erasing units, and each of the physical erasing units has a plurality of physical programming units. The memory control circuit unit includes: a host interface configured to couple to a host system; a memory interface configured to couple to the rewritable non-volatile memory module; and a memory management circuit coupled to the host interface and the memory interface. The memory management circuit is configured to at least group the physical erasing units into a temporary area and a storage area, wherein the physical erasing units of the temporary area are operated in a single-page mode for writing data and the physical erasing units of the storage area are operated in a multi-page mode for writing data. Further, the memory management circuit is further configured to select a first physical erasing unit from among the physical erasing units of the temporary area, copy a plurality of valid data in the first physical erasing unit to a second physical erasing unit among the physical erasing units of the temporary area, and perform an erasing operation on the first physical erasing unit. Further, the memory management circuit is further configured to select a third physical erasing unit from among the physical erasing units of the temporary area, copy a plurality of valid data in the third physical erasing unit to a fourth physical erasing unit among the physical erasing units of the storage area, and perform the erasing operation on the third physical erasing unit.

An exemplary embodiment of the invention provides a memory storage apparatus including: a connection interface unit configured to connect to a host system, a rewritable non-volatile memory module and a memory control circuit unit. The rewritable non-volatile memory module has a plurality of physical erasing units and each of the physical erasing units has a plurality of physical programming units. The memory control circuit unit is coupled to the connection interface unit and the rewritable non-volatile memory module, and configured to at least group the physical erasing units into a storage area and a temporary area, wherein the physical erasing units of the temporary area are operated in a single-page mode for writing data and the physical erasing units of the storage area are operated in a multi-page mode for writing data. Further, the memory control circuit unit is further configured to select a first physical erasing unit from among the physical erasing units of the temporary area, copy a plurality of valid data in the first physical erasing unit to a second physical erasing unit among the physical erasing units of the temporary area, and perform an erasing operation on the first physical erasing unit. Further, the memory control circuit unit is further configured to select a third physical erasing unit from among the physical erasing units of the temporary area, copy a plurality of valid data in the third physical erasing unit to a fourth physical erasing unit among the physical erasing units of the storage area, and perform the erasing operation on the third physical erasing unit.

Based on the above, according to the data writing method, the memory control circuit unit and the memory storage apparatus proposed by the invention, by performing the data merging operation on the physical erasing units within the temporary area and performing the data merging operation for copying valid data from the physical erasing units of the temporary area into the physical erasing units of the storage area, the physical erasing units may be prevented from rapid decline in the operating life and reduction in access speed which are caused by the multi-page mode being overly used.

To make the above features and advantages of the present disclosure more comprehensible, several embodiments accompanied with drawings are described in detail as follows.

It may be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
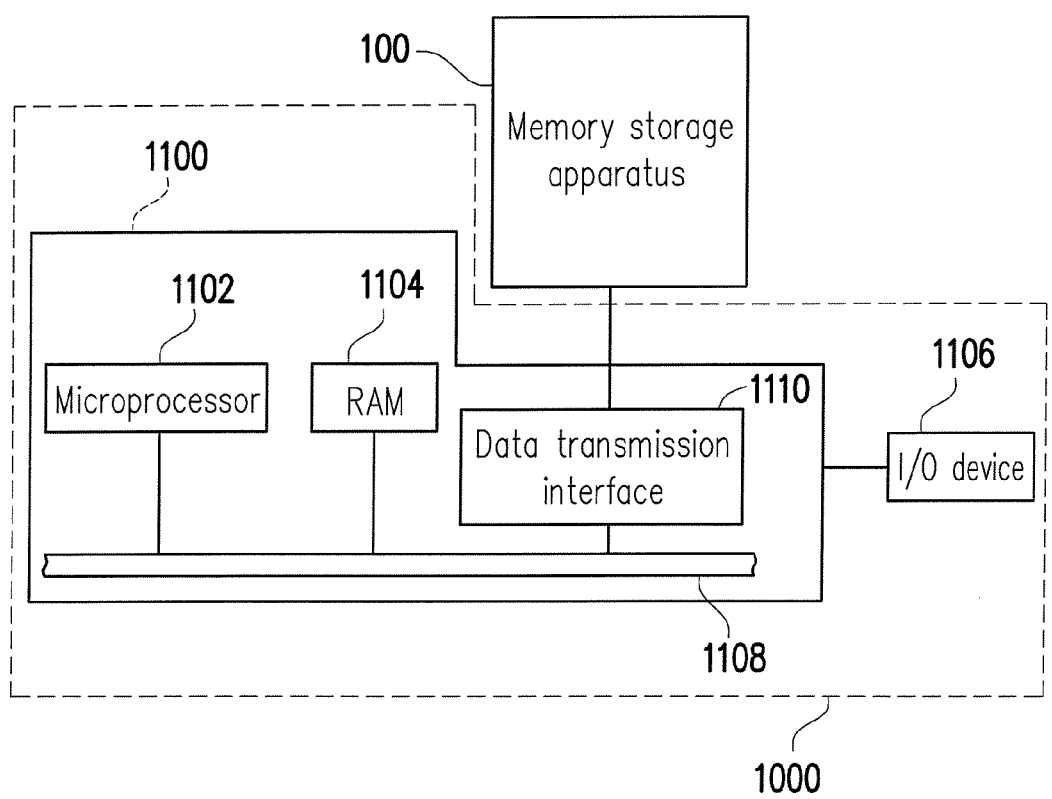
FIG. 1A is a schematic diagram of a host system and a memory storage apparatus according to an exemplary embodiment.

Reference will now be made in detail to the present embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1A is a schematic diagram of a host system and a memory storage apparatus according to an exemplary embodiment.

Figure 1B:
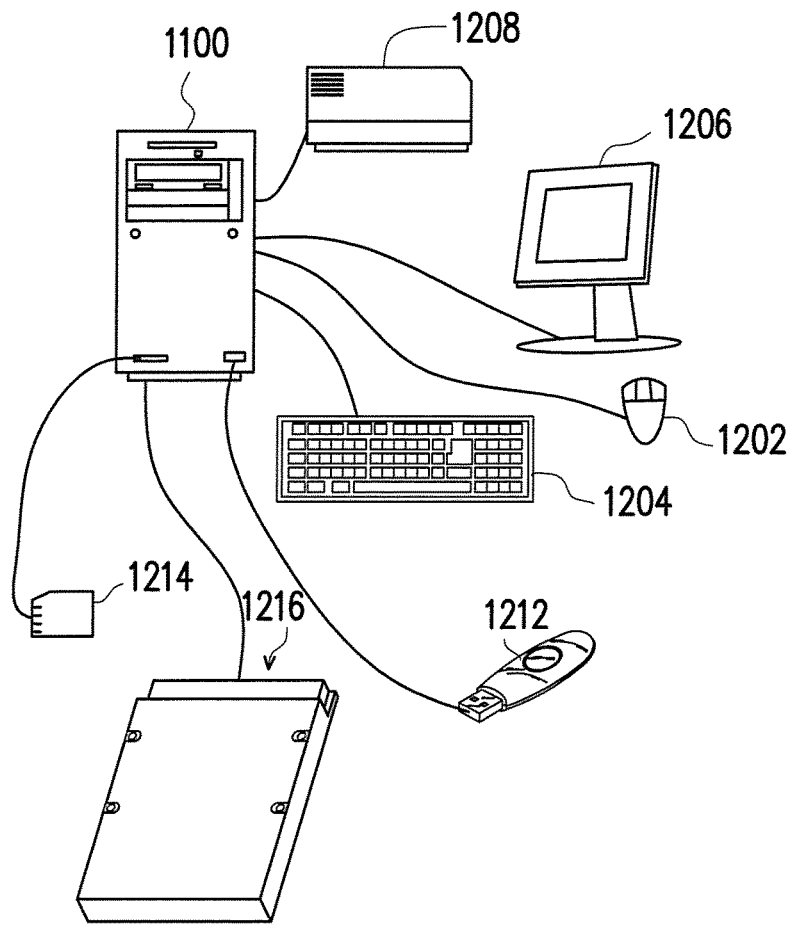
FIG. 1B is a schematic diagram illustrating a computer, an input/output device and a memory storage apparatus according to an exemplary embodiment.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It may be understood that the devices illustrated in FIG. 1B are not intended to limit the I/O device 1106, and the I/O device 1106 may further include other devices.

In the present exemplary embodiment, a memory storage apparatus 100 is electrically connected to other devices of the host system 1000 through the data transmission interface 1110. By using the microprocessor 1102, the random access memory 1104 and the Input/Output (I/O) device 1106, data may be written into the memory storage apparatus 100 or may be read from the memory storage apparatus 100. For example, the memory storage apparatus 100 may be a rewritable non-volatile memory storage apparatus such as a flash drive 1212, a memory card 1214, or a solid state drive (SSD) 1216 depicted in FIG. 1B.

Figure 1C:
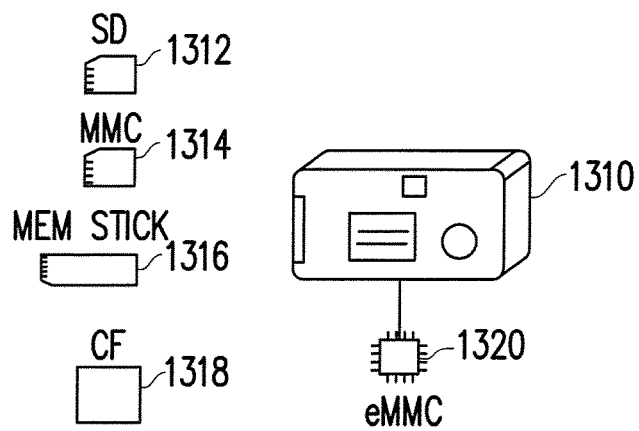
FIG. 1C is a schematic diagram of a host system and a memory storage apparatus according to an exemplary embodiment.

Generally, the host system 1000 may substantially be any system capable of storing data with the memory storage apparatus 100. Even though the host system 1000 is illustrated as a computer system in the present exemplary embodiment, in another exemplary embodiment of the invention, the host system 1000 may be a digital camera, a video camera, a telecommunication device, an audio player, or a video player. For example, if the host system is a digital camera (video camera) 1310 depicted in FIG. 1C, the rewritable non-volatile memory storage apparatus may be a SD card 1312, a MMC card 1314, a memory stick 1316, a CF card 1318 or an embedded storage device 1320 (as shown in FIG. 1C). The embedded storage apparatus 1320 includes an Embedded MMC (eMMC). It may be mentioned that the eMMC is electrically connected to a substrate of the host system, directly.

Figure 2:
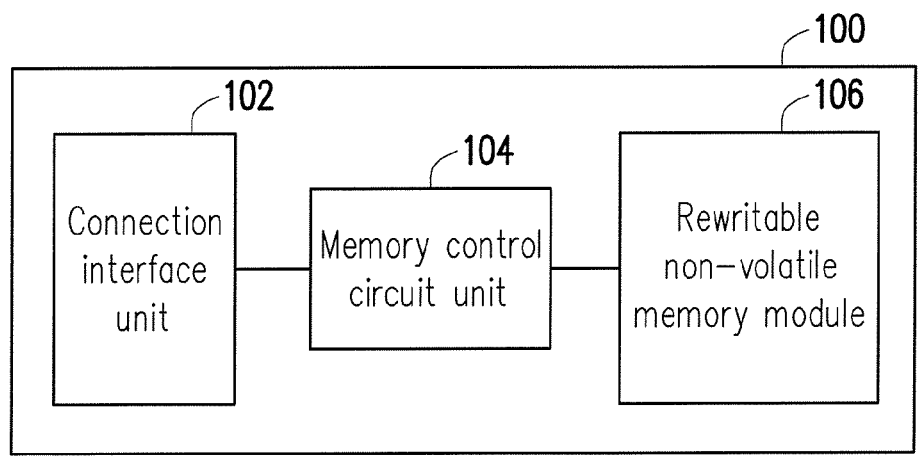
FIG. 2 is a schematic block diagram illustrating a memory storage apparatus according to an exemplary embodiment.

FIG. 2 is a schematic block diagram illustrating a memory storage apparatus according to an exemplary embodiment.

Referring to FIG. 2, the memory storage apparatus 100 includes a connection interface unit 102, a memory control circuit unit 104 and a rewritable non-volatile memory module 106.

In the present exemplary embodiment, the connection interface unit 102 is compatible with a Secure Digital (SD) interface standard. However, the invention is not limited thereto, and the connection interface unit 102 may also be compatible to Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Serial Advanced Technology Attachment (SATA) standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connection interface unit and the memory control circuit unit may be packaged into one chip, or distributed outside of a chip containing the memory control circuit unit.

The memory control circuit unit 104 is configured to execute a plurality of logic gates or control commands which are implemented in a hardware form or in a firmware form, so as to perform operations of writing, reading, erasing and merging data in the rewritable non-volatile memory module 106 according to the commands of the host system 1000.

The rewritable non-volatile memory module 106 is coupled to the memory control circuit unit 104 and configured to store data written from the host system 1000. The rewritable non-volatile memory module 106 includes a plurality of physical erasing units. For example, the physical erasing units may belong to the same memory die or belong to different memory dies. Each of the physical erasing units has a plurality of physical programming units (e.g., in the exemplary embodiments of the invention, each of the physical erasing units includes 258 physical programming units), and the physical programming units of the same physical erasing unit may be written separately and erased simultaneously. Nevertheless, it may be understood that the invention is not limited thereto. Each physical erasing unit is composed by 64 physical programming units, 256 physical programming units or any amount of the physical programming units.

More specifically, the physical erasing unit is the minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the physical programming unit contains 4 physical access addresses, and the size of each physical access address is 512 byte. However, in other exemplary embodiments, the data bit area may also include more or less of the physical access addresses, and an amount and a size of the physical access addresses are not limited in the invention.

In the present exemplary embodiment of the invention, the rewritable non-volatile memory module 106 is a Trinary Level Cell (TLC) NAND-type flash memory module (i.e., a flash memory module capable of storing three bits data in one memory cell). However, the present invention is not limited thereto. The rewritable non-volatile memory module 106 may also be a Multi Level Cell (MLC) NAND-type flash memory module (i.e., a flash memory module capable of storing two bit data in one memory cell), other flash memory modules or other memory module having the same features.

Figure 3A:
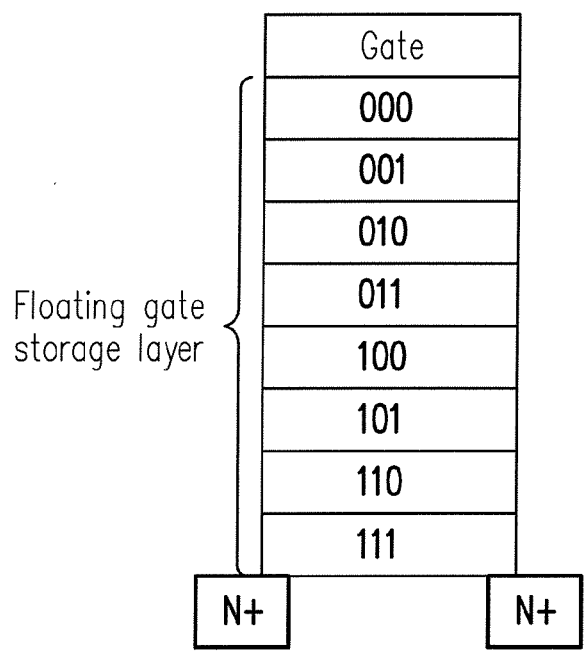
FIG. 3A and FIG. 3B are schematic diagrams illustrating a memory cell storage structure and a physical erasing unit according to an exemplary embodiment.
Figures 3B, 4:
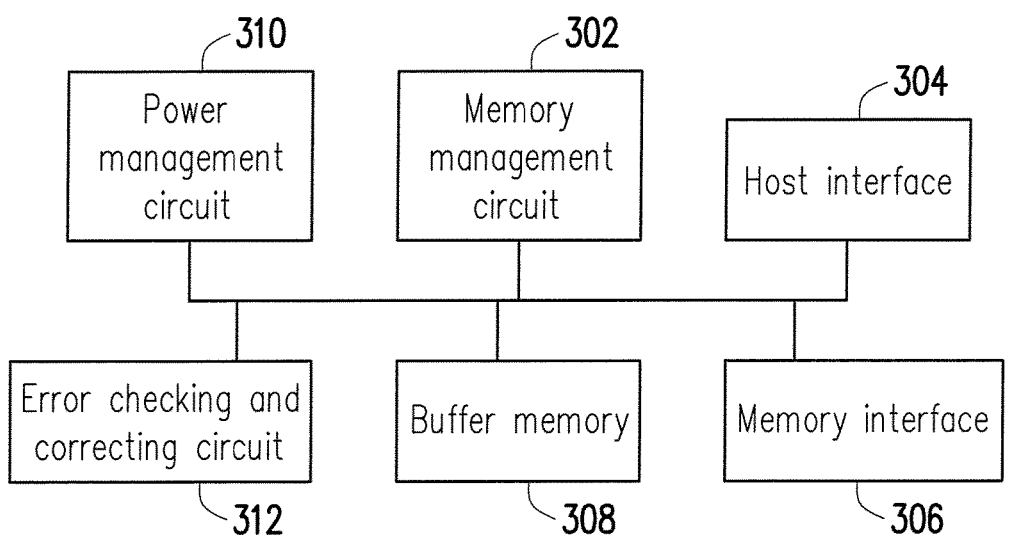
FIG. 4 is a schematic block diagram illustrating a memory control circuit unit according to an exemplary embodiment.

FIG. 3A and FIG. 3B are schematic diagrams illustrating a memory cell storage structure and a physical erasing unit according to the present exemplary embodiment.

Referring to FIG. 3A, each storage state of each memory cell in the rewritable non-volatile memory module 106 can be identified as "111", "110", "101", "100", "011", "010", "001" or "000" (as shown in FIG. 3A). The first bit counted from the left side of the storage state is the LSB, the second bit counted from the left side of the storage state is the CSB and the third bit counted from the left side of the storage state is the MSB. In addition, the memory cells arranged on the same word line can constitute three physical programming units. Herein, the physical programming units constituted by the LSBs of said memory cells are known as the lower physical programming unit, the physical programming units constituted by the CSBs of said memory cells are known as a center physical programming unit, and the physical programming units constituted by the MSBs of said memory cells are known as the upper physical programming unit.

Referring to FIG. 3B, one physical erasing unit is constituted by a plurality of physical programming unit groups, wherein each of the physical programming unit groups includes the lower physical programming unit, the center physical programming unit and the upper physical programming unit each is constituted by multiple memory cells arranged on the same word line. For example, in the physical erasing unit, a zeroth physical programming unit belonging to the lower physical programming unit, a first physical programming unit belonging to the center physical erasing unit and a second physical programming unit belonging to the upper physical programming unit are regarded as one physical programming unit group. Similarly, third, fourth, and fifth physical programming units are regarded as one physical programming unit group, and by analogy, the other physical programming units are also grouped into multiple physical programming unit groups by the same method.

FIG. 4 is a schematic block diagram illustrating a memory control circuit unit according to an exemplary embodiment. It may be understood that the memory control circuit unit illustrated in the FIG. 4 is merely an example, and the invention is not limited thereto.

Referring to FIG. 4, the memory control circuit unit 104 includes a memory management circuit 302, a host interface 304 and a memory interface 306.

The memory management circuit 302 is configured to control overall operations of the memory control circuit unit 104. Specifically, the memory management circuit 302 has a plurality of control commands. During operations of the memory storage apparatus 100, the control commands are executed to perform various operations such as writing data, reading data, erasing data and merging data.

In the present exemplary embodiment, the control commands of the memory management circuit 302 are implemented in a form of a firmware. For instance, the memory management circuit 302 has a microprocessor unit (not shown) and a read-only memory (not shown), and the control commands are burnt into the read-only memory. When the memory storage apparatus 100 operates, the control commands are executed by the microprocessor unit to perform the operations of writing data, reading data, erasing data and merging data.

According to another exemplary embodiment of the invention, the control commands of the memory management circuit 302 may also be stored into a specific area (for example, a system area in the memory module exclusively used for storing the system data) of the rewritable non-volatile memory module 106 as program codes. In addition, the memory management circuit 302 has a microprocessor unit (not illustrated), a ROM (not illustrated) and a RAM (not illustrated). Particularly, the ROM has an activate code, which is executed by the microprocessor unit to load the control commands stored in the rewritable non-volatile memory module 106 to the RAM of the memory management circuit 302 when the memory control circuit unit 104 is enabled. Thereafter, the control commands are executed by the microprocessor unit to perform the operations of writing data, reading data, erasing data and merging data.

Further, in another exemplary embodiment of the invention, the control commands of the memory management circuit 302 may also be implemented in a form of hardware. For example, the memory management circuit 302 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are electrically connected to the microprocessor. The memory management circuit is configured to manage the physical erasing units of the rewritable non-volatile memory module 106; the memory writing circuit is configured to issue a write command to the rewritable non-volatile memory module 106 in order to write data into the rewritable non-volatile memory module 106; the memory reading circuit is configured to issue a read command to the rewritable non-volatile memory module 106 in order to read data from the rewritable non-volatile memory module 106; the memory erasing circuit is configured to issue an erase command to the rewritable non-volatile memory module 106 in order to erase data from the rewritable non-volatile memory module 106; the data processing circuit is configured to process both the data to be written to the rewritable non-volatile memory module 106 and the data to be read from the rewritable non-volatile memory module 106.

The host interface 304 is electrically connected to the memory management circuit 302 and configured to receive and identify commands and data sent from the host system 1000. In other words, the commands and data sent from the host system 1000 are passed to the memory management circuit 302 through the host interface 304. In the present exemplary embodiment, the host interface 304 complies with the SD standard. However, it may be understood that the present invention is not limited thereto, and the host interface 304 may also be compatible with a PATA standard, an IEEE 1394 standard, a PCI Express standard, a USB standard, a UHS-I standard, a UHS-II standard, a SATA standard, a MS standard, a MMC standard, a CF standard, an IDE standard, or other suitable standards for data transmission.

The memory interface 306 is coupled to the memory management circuit 302 and configured to access the rewritable non-volatile memory module 106. That is to say, data to be written to the rewritable non-volatile memory module 106 is converted into a format acceptable to the rewritable non-volatile memory module 106 by the memory interface 306.

In an exemplary embodiment, the memory control circuit unit 104 further includes a buffer memory 308, a power management circuit 310 and an error checking and correcting circuit 312.

The buffer memory 308 is coupled to the memory management circuit 302 and configured to temporarily store data and commands from the host system 1000 or data from the rewritable non-volatile memory module 106.

The power management unit 310 is coupled to the memory management circuit 302 and configured to control a power of the memory storage apparatus 100.

The error checking and correcting circuit 312 is coupled to the memory management circuit 302 and configured to execute an error checking and correcting process to ensure the correctness of data. Specifically, when the memory management circuit 302 receives a write command from the host system 1000, the error checking and correcting circuit 312 generates an error checking and correcting code (ECC code) for data corresponding to the write command, and the memory management circuit 302 writes data and the ECC code corresponding to the write command to the rewritable non-volatile memory module 106. Subsequently, when the memory management circuit 302 reads the data from the rewritable non-volatile memory module 106, the error checking and correcting code corresponding to the data is also read, and the error checking and correcting circuit 312 executes the error checking and correcting procedure for the read data according to the error checking and correcting code.

Figure 5:
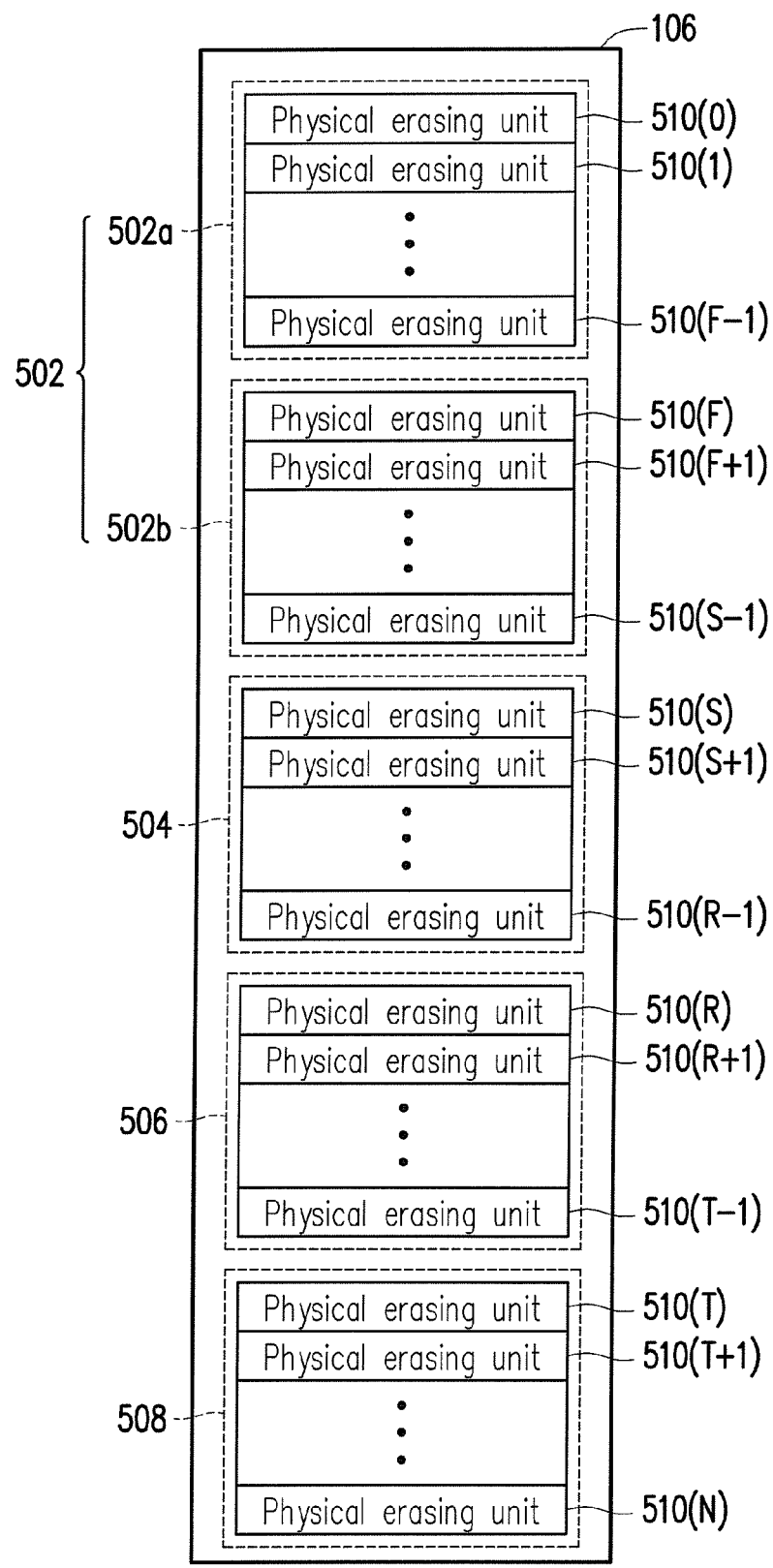
FIG. 5 and FIG. 6 are schematic diagrams illustrating a management of the physical erasing units according to an exemplary embodiment.
Figure 6:
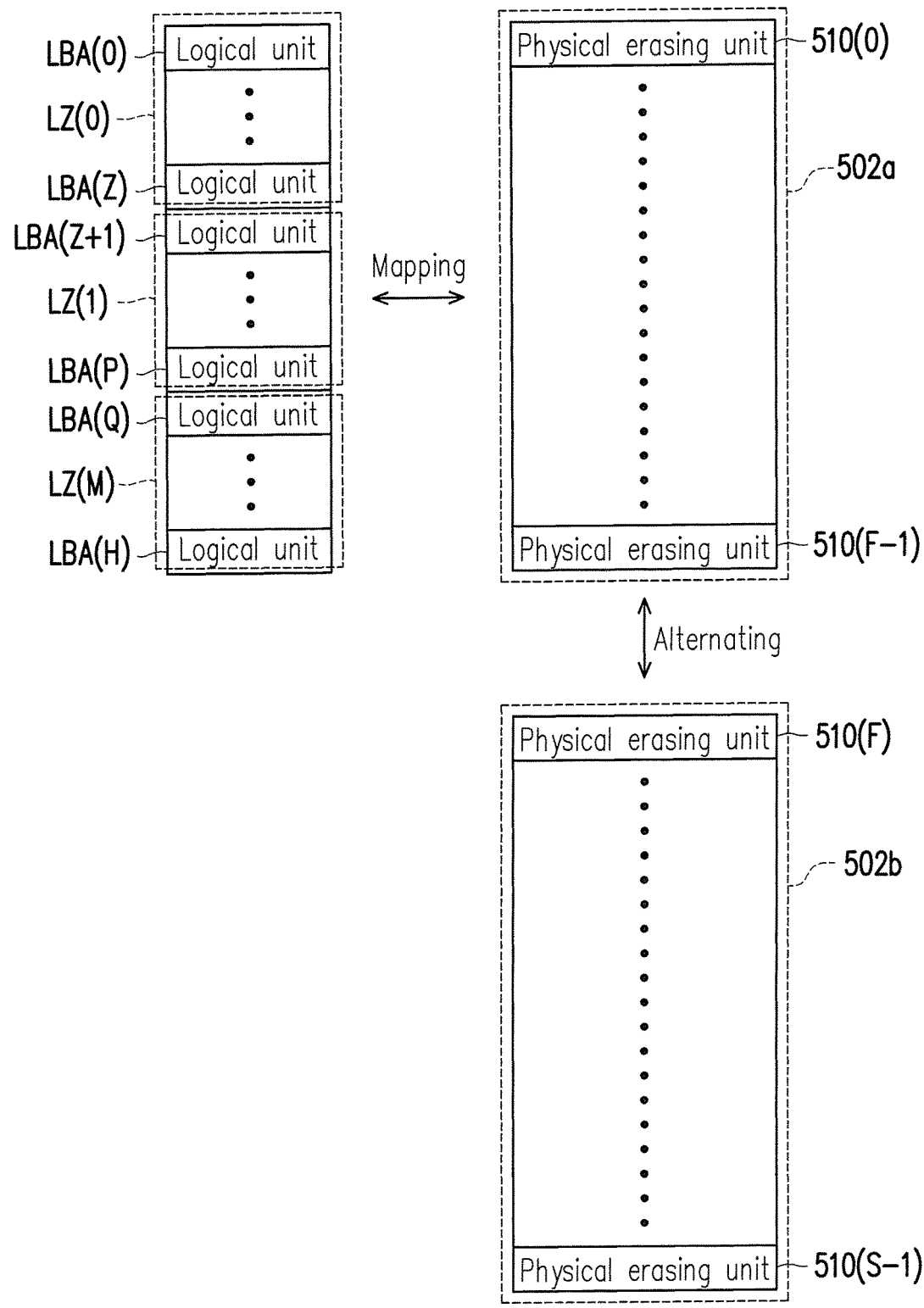

FIG. 5 and FIG. 6 are schematic diagrams illustrating a management of the physical erasing units according to an exemplary embodiment.

Referring to FIG. 5, the rewritable non-volatile memory module 106 includes physical erasing units 510(0) to 510(N), and the memory control circuit unit 104 (or the memory management circuit 302) logically groups the physical erasing units 510(0) to 510(N) into a storage area 502, a temporary area 504, a system area 506 and a replacement area 508. It may be understood that, amounts of the physical erasing units in the storage area 502, the temporary area 504, the system area 506 and the replacement area 508 are different based on different memory specifications, which are not particularly limited by the present disclosure.

The physical erasing units logically belonging to the storage area 502 are configured to store data from the host system 1000. Specifically, the storage area 502 includes a data area 502a and a spare area 502b. The physical erasing units of the data area 502a are regarded as the physical erasing units already stored with data, and the physical erasing units of the spare area 502b are configured to replace the physical erasing units of the data area 502a. In other words, when the write command and the data to be written are received from the host system 1000, the memory control circuit unit 104 (or the memory management unit 302) retrieves the physical erasing units from the spare area 502b, and writes the data into the selected physical erasing units as a replacement to the physical erasing units in the data area 502a.

The physical erasing units logically belonging to the temporary area 504 are used as temporary physical erasing units of a temporary physical erasing unit group corresponding to the logical unit, and configured to temporarily store the data written by the host system 1000. Detailed method and steps for temporarily storing data will be described later with reference to the drawings.

The physical erasing units logically belonging to the system area 506 are configured to record the system data. For example, the system data includes a logical-to-physical address mapping table, information related to manufacturer and model of the rewritable non-volatile memory module, a number of physical erasing units in the rewritable non-volatile memory module, a number of the physical programming units in each physical erasing unit, and the like.

The physical erasing units logically belonging to the replacement area 508 are used in a bad physical erasing unit replacement procedure for replacing damaged physical erasing units. More specifically, if normal physical erasing units are still available in the replacement area 508 when the physical erasing units of the data area 502a are damaged, the memory management circuit 302 selects the normal physical erasing units from the replacement area 508 in order to replace the damaged physical erasing units.

Referring to FIG. 6, the memory control circuit unit 104 (or the memory management circuit 302) configures logical units LBA(0) to LBA(H) for mapping to the physical erasing units of the data area 502, wherein each of the logical units includes a plurality of logical sub units for mapping to the corresponding physical programming units of the physical erasing units. Further, when the host system 1000 intends to write the data into the logical units or update the data stored in the logical units, the memory control circuit unit 104 (or the memory management unit 302) gets one physical erasing unit from the spare area 502b for writing the data as an alternately exchange of the physical erasing unit of the data area 502a. In this exemplary embodiment, the logical sub-units may be logical pages or logical sectors.

In order to identify which of the physical erasing units is the data of each logical unit being stored to, the memory control circuit unit 104 (or the memory management circuit 302) records mapping relations between the logical units and the physical erasing units in the present exemplary embodiment. Further, when the host system 1000 intends to access the data in the logical sub-unit, the memory control circuit unit 104 (or the memory management circuit 302) confirms the logical unit to which the logical sub-unit belongs, and accesses the data in the physical erasing unit mapped to said logical unit. For instance, in the present exemplary embodiment, the memory control circuit unit 104 (or the memory management circuit 302) stores the logical-to-physical address mapping table into the rewritable non-volatile memory module 106 for recording the physical erasing unit mapped to each of the logical units, and the logical-to-physical address mapping table are loaded into the buffer memory 308 for maintenance when the memory control circuit unit 104 (or the memory management circuit 302) intends to access the data.

It may be noted that, the mapping table cannot record the mapping relations for all of the logical units because a capacity of the buffer memory 308 is limited. Therefore, in the present exemplary embodiment, the memory control circuit unit 104 (or the memory management unit 302) groups the logical units LBA(0) to LBA(H) into a plurality of logical zones LZ(0) to LZ(M), and configures one logical-to-physical address mapping table for each of the logical zones. In particular, when the memory control circuit unit 104 (or the memory management unit 302) intends to update the mapping relation for one specific logical unit, the logical-to-physical address mapping table corresponding to the logical zone to which the logical unit belongs to is loaded into the buffer memory 308 for updating.

In the present exemplary embodiment, when the write command instructing to store data into the logical units is received from the host system 1000, the memory control circuit unit 104 (or the memory management circuit 302) gets several physical erasing units from the temporary area 504 to serve as the temporary physical erasing units of the temporary physical erasing unit group corresponding to the logical units, and uses a single-page mode to temporarily store first data into the lower physical programming units of the temporary physical erasing units. Thereafter, the memory control circuit unit 104 (or the memory management circuit 302) uses a multi-page mode to write the data in the temporary physical erasing unit group into the corresponding physical erasing unit in the storage area 502 and maps the logical unit to the corresponding physical erasing unit.

Herein, the so-called single-page mode refers to use of only the lower physical programming unit for storing data. In other words, in the single-page mode, the memory control circuit unit 104 (or the memory management circuit 302) performs the operation of writing data only on the lower physical programming unit. Because the temporary physical erasing units are operated by using the single-page mode, in the present exemplary embodiment, only ⅓ capacity of one temporary physical erasing unit is used and three temporary physical erasing units are included in the temporary physical erasing unit group corresponding to one logical unit in order to provide a sufficient space for storing the data of one logical unit. In the present exemplary embodiment, the memory control circuit unit 104 (or the memory management circuit 302) uses the single-page mode to operate the physical erasing units of the temporary area 504, or uses the single-page mode to operate the temporary physical erasing units in the temporary physical erasing unit group.

The so-called multi-page mode refers to use of the lower physical programming unit, the center physical programming unit and the upper physical programming unit for storing data. In other words, when the multi-page mode is used for writing data, the memory control circuit unit 104 (or the memory management circuit 302) programs the lower physical programming unit, the center physical programming unit and the upper physical programming unit of one physical programming unit group. It may be noted that, in an exemplary embodiment, when the multi-page mode is used to operate the physical erasing unit, the physical programming units in the same physical programming unit group are simultaneously or periodically programmed. Furthermore, in comparison with the physical erasing units operated in the single-page mode, the operating life of the physical erasing units operated in the multi-page mode is shorter. Specifically, the writing or erasing count of each physical erasing unit is limited. When the writing or erasing count of one specific physical erasing unit exceeds a threshold, the specific physical erasing unit may be damaged and no longer available for data to be written. Herein, the threshold corresponding to the physical erasing units operated in the multi-page mode is lower than the threshold corresponding to the physical erasing units operated in the single-page mode. In the present exemplary embodiment, the memory control circuit unit 104 (or the memory management circuit 302) uses the multi-page mode to operate the physical erasing units associated to the storage area 502.

In the present exemplary embodiment, after one specific physical erasing unit is grouped into the temporary area 504, the specific physical erasing unit can only be used by the temporary area 504 rather than being used together with the physical erasing units of the storage area 502. In other words, the memory control circuit unit 104 (or the memory management circuit 302) operates the physical erasing units of the storage area 502 and temporary area 504, separately. For example, after one specific physical erasing unit is grouped into the temporary area 504, the memory control circuit unit 104 (or the memory management circuit 302) operates the specific physical erasing unit of the temporary area 504 by using the single-page mode until the specific physical erasing unit is damaged.

Figure 7:
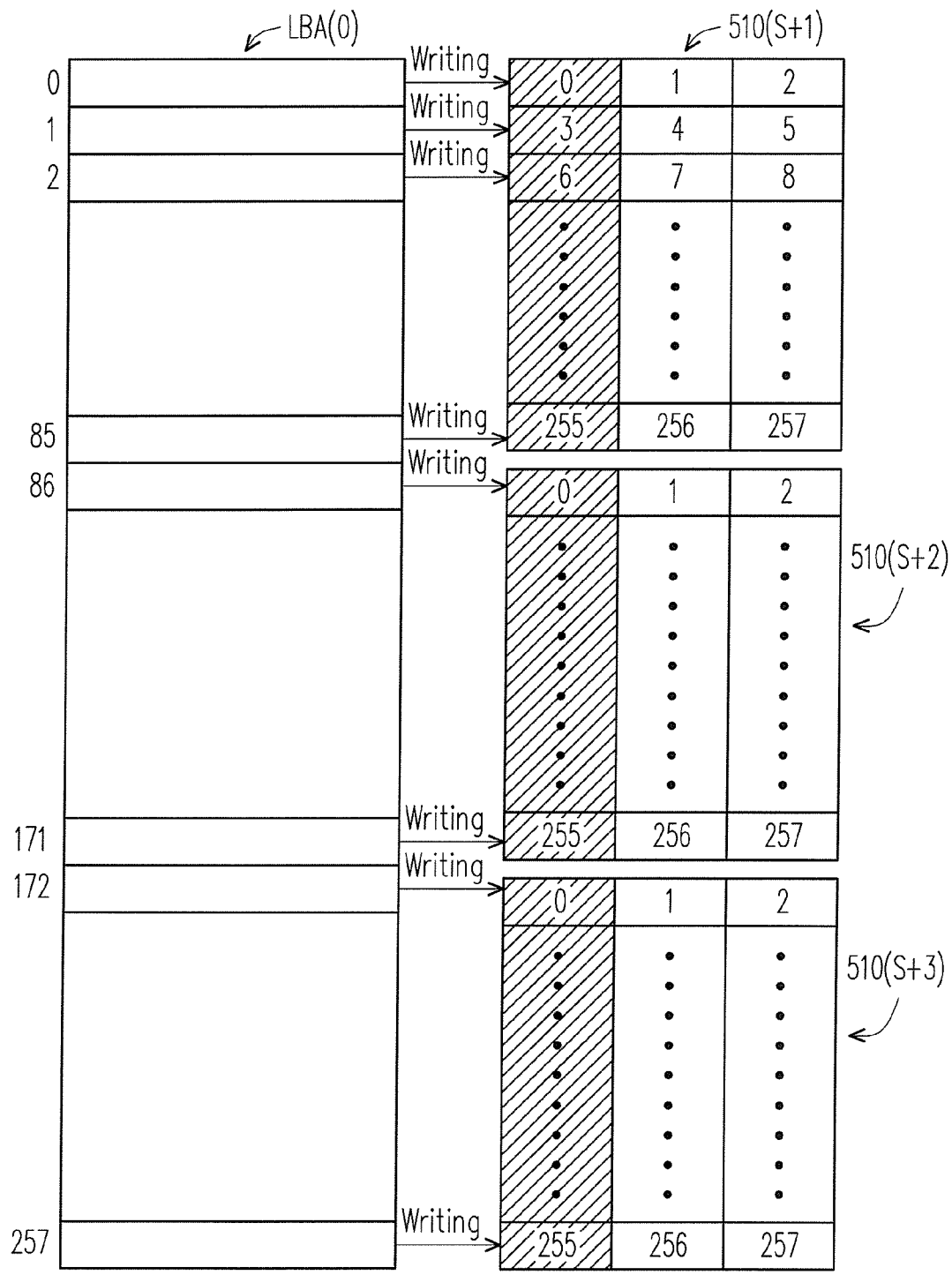
FIG. 7 illustrates a schematic diagram for temporarily storing data into the temporary area by using the single-page mode according to an example.

FIG. 7 illustrates a schematic diagram for temporarily storing data into the temporary area by using the single-page mode according to an example.

Referring to FIG. 7, when the memory storage apparatus 100 receives a write command instructing to store update data into $0^{th}$ to $257^{th}$ logical sub units of the logical unit LBA(0) from the host system 1000, it is assumed in the present exemplary embodiment that, the memory control circuit unit 104 (or the memory management circuit 302) merely gets three physical erasing units (S+1), 510(S+2) and 510(S+3) from the temporary area 504 to serve as a plurality of temporary physical erasing unit of a temporary physical erasing unit group corresponding to the logical unit LBA(0). In this case, the memory control circuit unit 104 (or the memory management circuit 302) uses the temporary physical erasing unit 510(S+1), the temporary physical erasing unit 510(S+2), the temporary physical erasing unit 510(S+3) of the temporary physical erasing unit group corresponding to the logical unit LBA(0) for writing the updated data belonging to the logical unit LBA(0).

For example, the memory control circuit unit 104 (or the memory management circuit 302) writes the updated data to be stored into the $0^{th}$ to $85^{th}$ logical sub units of the logical unit LBA(0) sequentially into the lower physical programming units of the temporary physical erasing unit 510(S+1), writes the updated data to be stored into the $86^{th}$ to $171^{st}$ logical sub units of the logical unit LBA(0) sequentially into the lower physical programming units of the temporary physical erasing unit 510(S+2) and writes the updated data to be stored into the $172^{nd}$ to $257^{th}$ logical sub units of the logical unit LBA(0) sequentially into the lower physical programming units of the temporary physical erasing unit 510(S+3). It is worth mentioning that, when writing a massive amount of data are continuously, a cache programming command may be utilized for writing data according to a page order of the temporary physical erasing unit 510(S+

1), the temporary physical erasing unit 510(S+2) and the temporary physical erasing unit 510(S+3), so as to effectively improve the speed for writing data. For example, the memory control circuit unit 104 (or the memory management circuit 302) reorganizes or rearranges the updated data to be stored into each of the logical sub units of the logical unit LBA(0) before simultaneously the reorganized or rearranged data into the lower physical programming units of the temporary physical erasing unit 510(S+1), the lower physical programming units of the temporary physical erasing unit 510(S+2) and the lower physical programming units of the temporary physical erasing unit 510(S+3).

Figure 8:
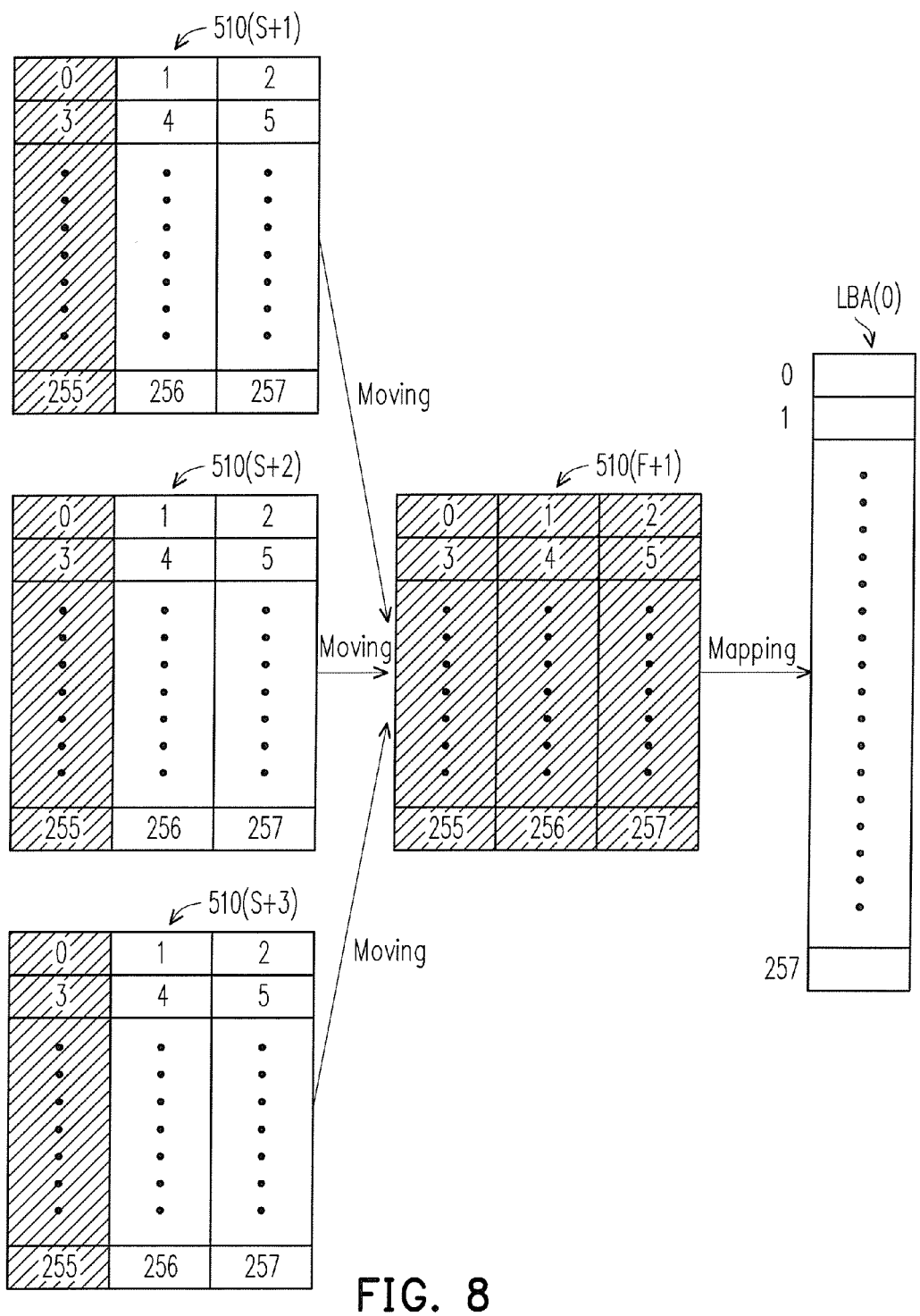
FIG. 8 illustrates a schematic diagram for writing the data temporarily stored in the temporary area by using the multi-page mode according to an example.

FIG. 8 illustrates a schematic diagram for writing the data temporarily stored in the temporary area by using the multi-page mode according to an example.

In the case where the temporary physical erasing unit 510(S+1), the temporary physical erasing unit 510(S+2) and the physical erasing unit 510(S+3) of the temporary physical erasing unit group corresponding to the logical unit LBA(0) are already stored with valid data of all the logical sub units of the logical unit LBA(0) (as shown by FIG. 7), first of all, as illustrated in FIG. 8, the memory control circuit unit 104 (or the memory management circuit 302) gets one physical erasing unit from the spare area 502b to serve as a physical erasing unit 510(F+1) for alternating. Specifically, the memory control circuit unit 104 (or the memory management circuit 302) selects one empty physical erasing unit or one specific physical erasing unit stored with invalid data from the spare area 502b. Particularly, if the selected physical erasing unit is the specific physical erasing unit stored with the invalid data, the memory control circuit unit 104 (or the memory management circuit 302) first preforms an erasing operation on the specific physical erasing unit. In other words, the invalid data of the physical erasing unit may be erased first.

Thereafter, the memory control circuit unit 104 (or the memory management circuit 302) copies the valid data belonging to the $0^{th}$ to $85^{th}$ logical sub units of the logical unit LBA(0) from the lower physical programming units of the temporary physical erasing unit 510(S+1) to a corresponding page (e.g., $0^{th}$ to $85^{th}$ physical programming units) of the physical erasing unit 510(F+1). Next, the memory control circuit unit 104 (or the memory management circuit 302) copies the valid data belonging to the $86^{th}$ to $171^{st}$ logical sub units of the logical unit LBA(0) from the lower physical programming units of the temporary physical erasing unit 510(S+2) to a corresponding page (e.g., $86^{th}$ to $171^{st}$ physical programming units) of the physical erasing unit 510(F+1). Then, the memory control circuit unit 104 (or the memory management circuit 302) copies the valid data belonging to the $172^{nd}$ to $257^{th}$ logical sub units of the logical unit LBA(0) from the lower physical programming units of the temporary physical erasing unit 510(S+3) to a corresponding page (e.g., $172^{nd}$ to $257^{th}$ physical programming units) of the physical erasing unit 510(F+1).

It may be noted that, as described above, because the physical erasing units associated with the data area 502a are operated in the multi-page mode, the physical erasing unit 510(F+1) are simultaneously or periodically programmed by using the physical programming unit group as a unit. Specifically, in an exemplary embodiment, the $0^{th}$, $1^{st}$ and $2^{nd}$ physical programming units of the physical erasing unit 510(F+1) are simultaneously programmed for writing the data belonging to the $0^{th}$, $1^{st}$ and $2^{nd}$ logical sub units of the logical unit LBA(0); the $3^{rd}$, $4^{th}$ and $5^{th}$ physical programming units of the physical erasing unit 510(F+1) are simultaneously programmed for writing the data belonging to the $3^{rd}$, $4^{th}$ and $5^{th}$ logical sub units of the logical unit LBA(0); and by analogy, the data of the other logical sub units are all written into the physical erasing unit 510(F+1) by using the physical programming unit group as the unit.

Lastly, the memory control circuit unit 104 (or the memory management circuit 302) maps the logical unit LBA(0) to the physical erasing unit 510(F+1) in the logical-to-physical address mapping table and performs the erasing operation on the temporary physical erasing units 510(S+1) to 510(S+3) of the temporary physical erasing unit group corresponding to the logical unit. In other words, when the next write command is executed, the erased temporary physical erasing units 510(S+1) to 510(S+3) may be selected again as the temporary physical erasing units for the logical unit instructed by the next command.

It is worth mentioning that, in the present exemplary embodiment, after the updated data to be stored by the host system 1000 is written into the temporary area 504, the memory control circuit unit 104 (or the memory management circuit 302) transmits a response which notifies that the command is completed to the host system 1000. It is worth mentioning that, the valid data in the physical programming units of the temporary area 504 may become the invalid data because the corresponding updated data is written into another physical programming unit of the temporary area 504. Similarly, the valid data in the physical programming units of the data area 502a may also become the invalid data because the corresponding data is written into another physical programming unit of the temporary area 504. As such, because there may be many physical programming units stored with the invalid data in the temporary area 504 and the data area 502a, the memory control circuit unit 104 (or the memory management circuit 302) performs a data merging operation in order to recycle the physical programming units storing the invalid data. For example, when the memory storage apparatus 100 is in an idle state for a period of time (e.g. no command is received from the host system for over 30 seconds) or when an amount of the empty physical erasing units of the temporary area 504 or the spare area 502b is less than a predetermined threshold, the memory control circuit unit 104 (or the memory management circuit 302) performs the data merging operation on the valid data in the storage area 502 or the temporary area 504 such that the physical programming units only storing the invalid data can be returned to physical erasing units (i.e., empty physical erasing units). For instance, the predetermined threshold is set to be 3. Nevertheless, it may be understood that the present invention is not limited thereto, and the predetermined threshold may be other appropriate values.

In the present exemplary embodiment, the memory control circuit unit 104 (or the memory management circuit 302) may perform the data merging operation between the temporary area 504 and the storage area 502, perform the data merging operation within the temporary area 504 or perform the data operating operation within the storage area 502.

Figure 9:
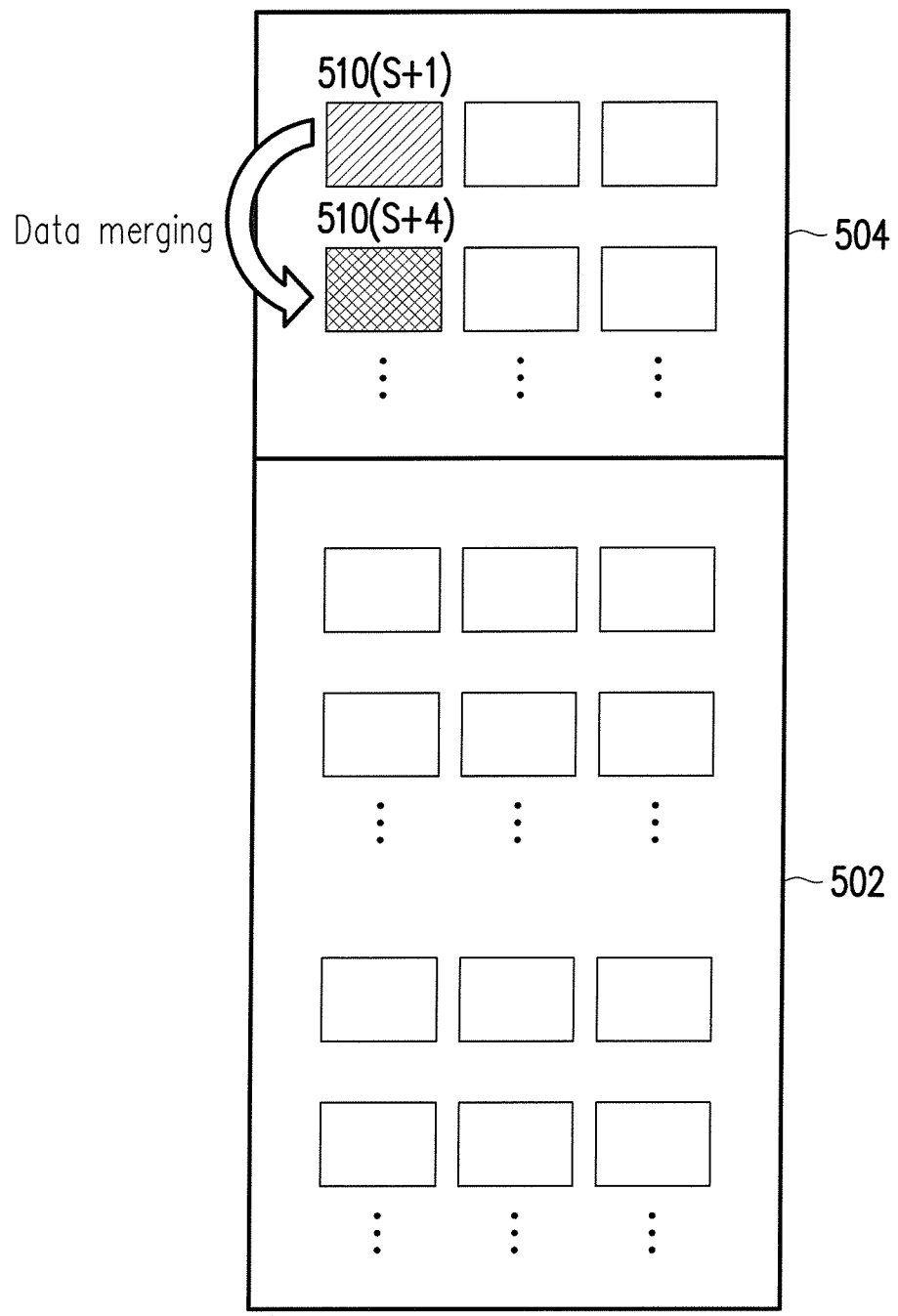
FIG. 9 illustrates a schematic diagram for executing the data merging operation in the temporary area according to an example.

FIG. 9 illustrates a schematic diagram for executing the data merging operation within the temporary area according to an example.

Referring to FIG. 9, it is assumed that the memory control circuit unit 104 (or the memory management circuit 302) intends to perform the data merging operation on the physical erasing units of the temporary area 504 (e.g., when the data merging operation is periodically performed on the physical erasing units of the temporary area 504 or when the host system 1000 is in the idle state). For example, the memory control circuit unit 104 (or the memory management circuit 302) selects the physical erasing unit 510(S+1) (also referred to a first physical erasing unit) from the temporary area 504; and copies the valid data in the physical erasing unit 510(S+1) to a physical erasing unit 510(S+4) (also referred to a second physical erasing unit) of the temporary area 504.

Specifically, the memory control circuit unit 104 (or the memory management circuit 302) reads the valid data from the lower physical programming units of the physical erasing unit 510(S+1), and writes the read valid data into the lower physical programming units of the physical erasing unit 510(S+4) (i.e., the operation of "Data merging" as shown in FIG. 9). Thereafter, the memory control circuit unit 104 (or the memory management circuit 302) maps the original logical sub units to which the valid data belongs in the physical erasing unit 510(S+1) to the physical erasing units of the physical erasing unit 510(S+4), and performs the erasing operation on the physical erasing unit 510(S+1) in order to release spaces of the physical erasing unit 510(S+1). In this example, the data merging operation performed in the temporary area 504 is capable of reducing the performing of the data merging operation for copying the valid data from the temporary area 504 to the storage area 502 and reducing the writing (erasing) count for the physical erasing units of the storage area 502, so as to effectively improve performances and the operating life of the rewritable non-volatile memory.

For example, in an exemplary embodiment, during the data merging operation performed in the temporary area 504, the memory control circuit unit 104 (or the memory management circuit 302) identifies at least one hot data from the physical erasing units of the temporary area 504, and selects the physical erasing unit for performing the data merging operation according to the at least one hot data. Specifically, the memory control circuit unit 104 (or the memory management circuit 302) records an update state of the data in the physical erasing unit of the temporary area 504 in order to identify whether the data in the physical erasing unit of the temporary area 504 is the hot data. Take FIG. 9 for example, if the update state of the data located in the physical erasing unit 510(S+1) of the temporary area 504 indicates that the data is recently (or frequently) updated by the host system 1000, the memory control circuit unit 104 (or the memory management circuit 302) identifies said data as the host data, and selects the physical erasing unit 510(S+1); storing the host data as the physical erasing unit for performing the data merging operation.

Other than selecting the physical erasing unit storing the hot data for performing the data merging operation within the temporary area 504 (as shown in FIG. 9), in another exemplary embodiment, the memory control circuit unit 104 (or the memory management circuit 302) may also record a valid data count of each of the physical erasing units of the temporary area 504 according to an amount of the valid data in the physical erasing units of the temporary area 504, and select the physical erasing unit for performing the data merging operation according to the valid data count of each of the physical erasing units. For example, the memory control circuit unit 104 (or the memory management circuit 302) selects the physical erasing unit with the valid data count being the smallest from among the physical erasing units of the temporary area 504 (i.e., the valid data count of the selected physical erasing unit is less than the valid data count of other physical erasing units in the temporary area 504) for performing the data merging operation.

Figure 10:
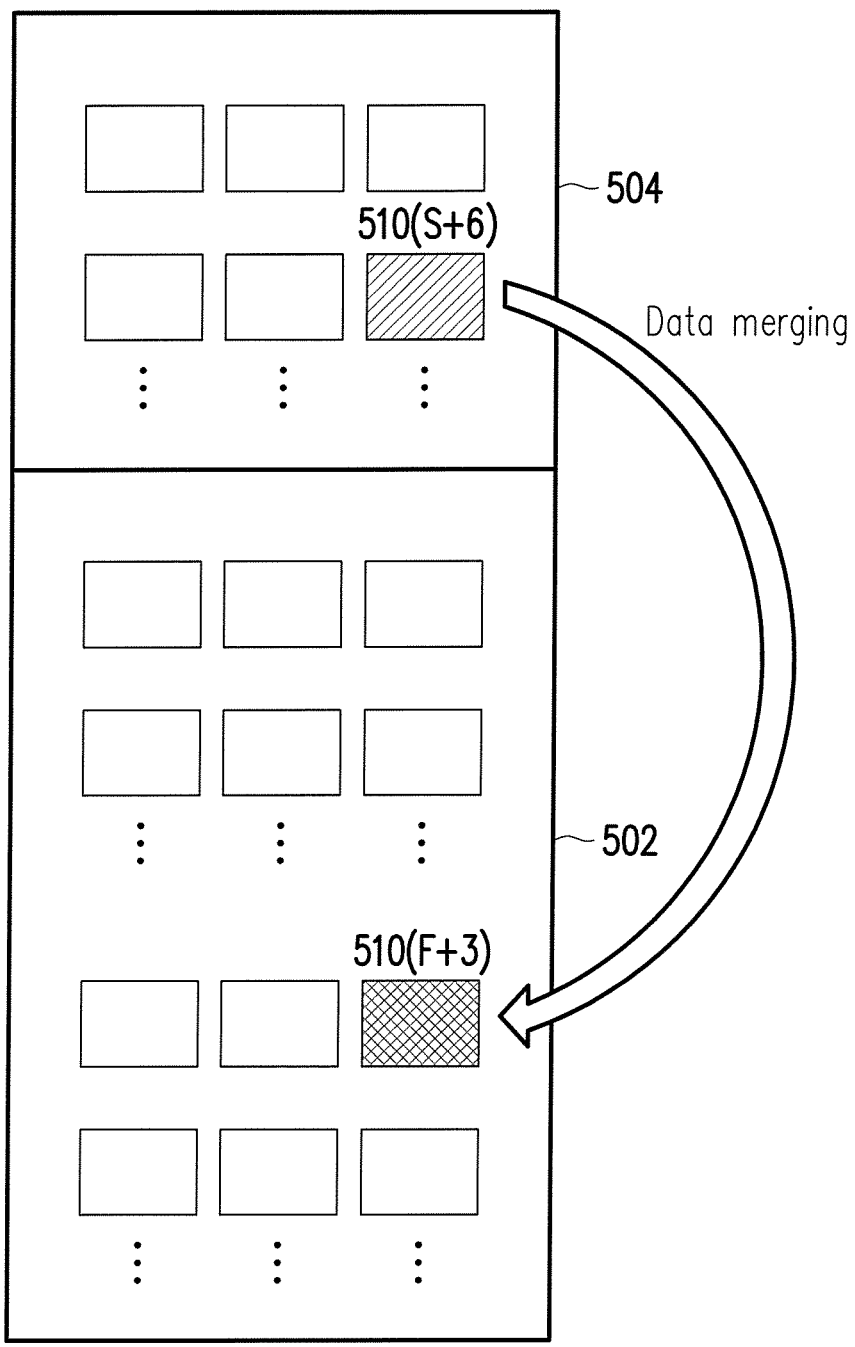
FIG. 10 illustrates a schematic diagram of the data merging operation for moving the valid data in the physical erasing units from the temporary area to the storage area according to an example.

FIG. 10 illustrates a schematic diagram of the data merging operation for moving the valid data in the physical erasing units from the temporary area to the storage area according to an example.

Referring to FIG. 10, it is assumed that the memory control circuit unit 104 (or the memory management circuit 302) intends to perform the data merging operation on the physical erasing units of the temporary area 504 (e.g., when the data merging operation is periodically performed on the physical erasing units of the temporary area 504, or when the host system 1000 is in the idle state, or when available spaces of the physical erasing units of the temporary area 504 are not sufficient). For example, the memory control circuit unit 104 (or the memory management circuit 302) selects a physical erasing unit 510(S+6) (also referred to a third physical erasing unit) from the temporary area 504 and stores the valid data in the physical erasing unit 510(S+6) into a physical erasing unit 510(F+3) (also referred to a fourth physical erasing unit) of the spare area 502b.

Specifically, the memory control circuit unit 104 (or the memory management circuit 302) reads the valid data from the lower physical programming units of the physical erasing unit 510(S+6), and writes the read valid data into the lower, center and upper physical programming units of the physical erasing unit 510(F+3). Thereafter, the memory control circuit unit 104 (or the memory management circuit 302) maps the original logical sub units to which the valid data in the physical erasing unit 510(S+6) to the physical programming units of the physical erasing unit 510(F+3), and perform is the erasing operation on the physical erasing unit 510(S+6) in order to release spaces of the physical erasing unit 510(S+6).

For example, in an exemplary embodiment, when the data merging operation of FIG. 10 is performed, the memory control circuit unit 104 (or the memory management circuit 302) identifies at least one cold data from the physical erasing units of the temporary area 504, and selects the physical erasing unit for performing the data merging operation according to the at least one cold data. Specifically, the memory control circuit unit 104 (or the memory management circuit 302) records an update state of the data in the physical erasing unit of the temporary area 504 in order to identify whether the data in the physical erasing unit of the temporary area 504 is the cold data. Take FIG. 10 for example, if the update state of the data located in the physical erasing unit 510(S+6) of the temporary area 504 indicates that the data is not recently (or less frequently) updated by the host system 1000, the memory control circuit unit 104 (or the memory management circuit 302) identifies the data as the cold data, and selects the physical erasing unit 510(S+6) that stores the cold data as the physical erasing unit for performing the data merging operation.

Other than selecting the physical erasing unit storing the cold data for performing the data merging operation as shown in FIG. 10, in another exemplary embodiment, the memory control circuit unit 104 (or the memory management circuit 302) may also record a valid data count of each of the physical erasing units of the temporary area 504 according to an amount of the valid data in the physical erasing units of the temporary area 504, and select the physical erasing unit for performing the data merging operation according to the valid data count of each of the physical erasing units. For example, the memory control circuit unit 104 (or the memory management circuit 302) selects the physical erasing unit with the valid data count being the largest from among the physical erasing units of the temporary area 504 (i.e., the valid data count of the selected physical erasing unit is greater than the valid data count of other physical erasing units in the temporary area 504) for performing the data merging operation.

Figure 11:
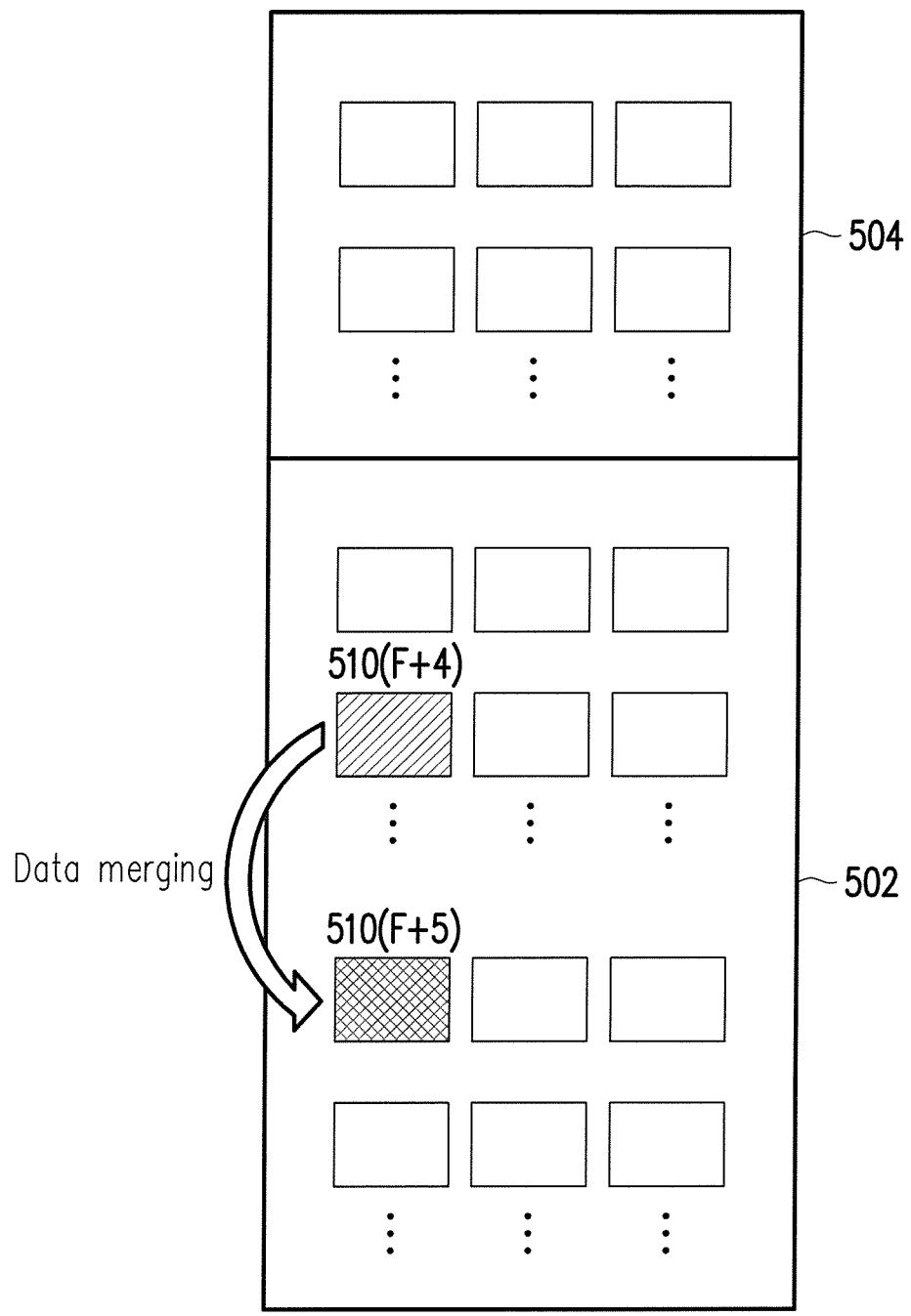
FIG. 11 illustrates a schematic diagram for performing the data merging operation on the physical erasing units of the storage area according to an example.

FIG. 11 illustrates a schematic diagram for performing the data merging operation on the physical erasing units of the storage area according to an example.

Referring to FIG. 11, it is assumed that the memory control circuit unit 104 (or the memory management circuit 302) intends to perform the data merging operation on the physical erasing units of the storage area 502 (e.g., when the data merging operation is periodically performed on the physical erasing units of the storage area 502 or when the host system 1000 is in the idle state). The memory control circuit unit 104 (or the memory management circuit 302) selects a physical erasing unit 510(F+4) (also referred to a fifth physical erasing unit) from the data area 502a of the storage area 502 and stores the valid data in the physical erasing unit 510(F+4) into a physical erasing unit 510(F+5) (also referred to a sixth physical erasing unit) of the spare area 502b of the storage area 502.

Specifically, during the data merging operation, the memory control circuit unit 104 (or the memory management circuit 302) reads the valid data from the lower, center and upper physical programming units of the physical erasing unit 510(F+4), and writes the read valid data into the lower, center and upper physical programming units of the physical erasing unit 510(F+5) (i.e., the operation of "Data merging" as shown in FIG. 11). Thereafter, the memory control circuit unit 104 (or the memory management circuit 302) maps the original logical sub units to which the valid data belongs in the physical erasing unit 510(F+4) to the physical programming units of the physical erasing unit 510(F+5), and performs the erasing operation on the physical erasing unit 510(F+4) in order to release spaces of the physical erasing unit 510(F+4).

Figure 12:
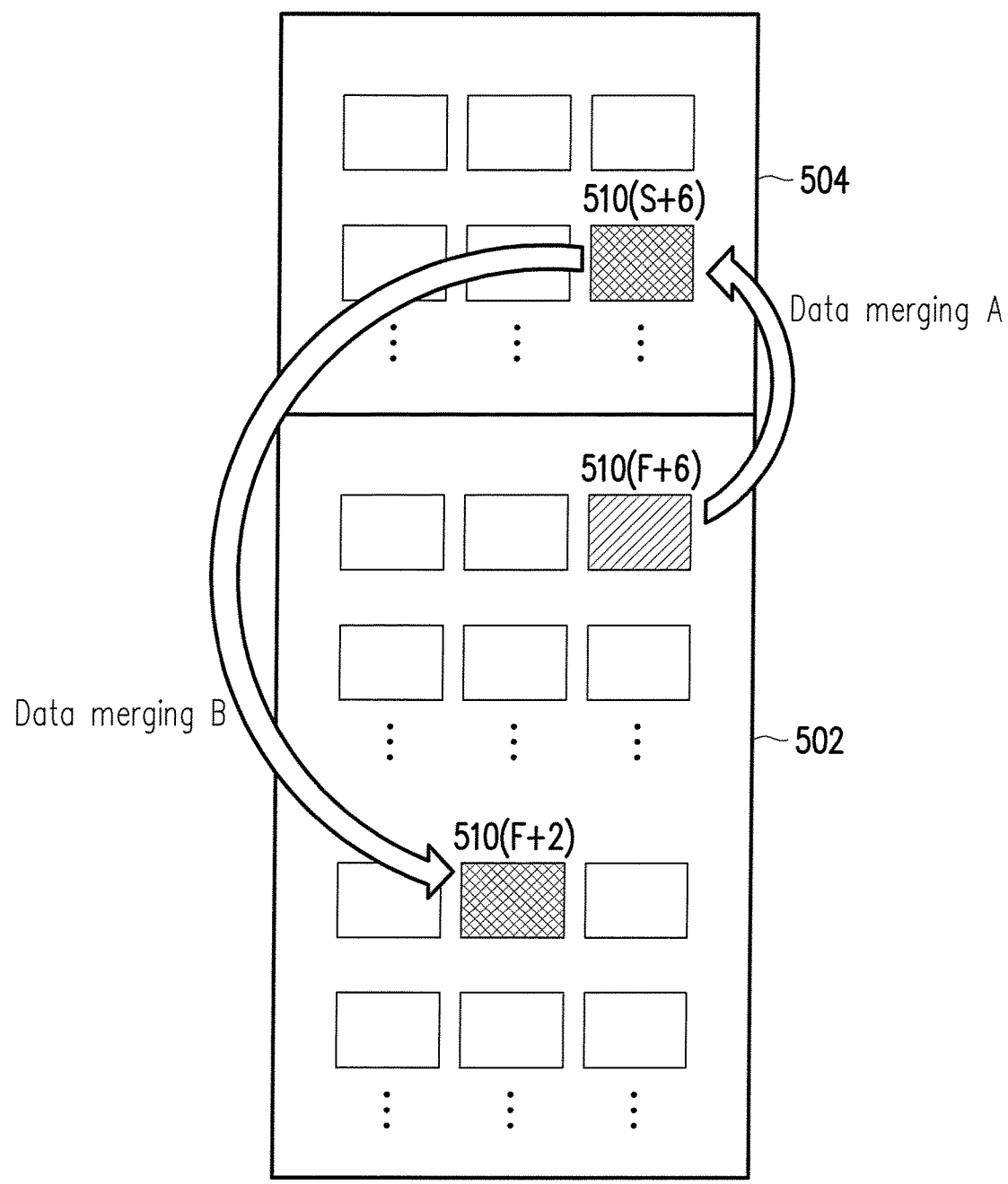
FIG. 12 illustrates a schematic diagram for performing the data merging operation on the physical erasing units of the storage area according to another example.

FIG. 12 illustrates a schematic diagram for performing the data merging operation on the physical erasing units of the storage area according to another example.

Referring to FIG. 12, it is assumed that the memory control circuit unit 104 (or the memory management circuit 302) intends to perform the data merging operation on the physical erasing units of the data area 502a of the storage area 502 (e.g., when the data merging operation is periodically performed on the physical erasing units of the data area 502a, or when the host system 1000 is in the idle state, or when the physical erasing units of the spare area 502b are exhausted). The memory control circuit unit 104 (or the memory management circuit 302) selects a physical erasing unit 510(F+6) (also referred to a seventh physical erasing unit) from the data area 502a of the storage area 502, selects a physical erasing unit 510(S+6) (also known an eighth physical erasing unit) from the temporary area 504 to serve as a buffer area for the data merging operation, and copies the valid data in the physical erasing unit 510(F+6) to the physical erasing unit 510(S+6). Specifically, the memory control circuit unit 104 (or the memory management circuit 302) reads the valid data from the lower, center and upper physical programming units of the physical erasing unit 510(F+6), writes the read valid data into the lower physical programming units of the physical erasing unit 510(S+6) (i.e., this is the operation of "Data merging A" as shown in FIG. 12), and performs the erasing operation on the physical erasing unit 510(F+6) in order to release spaces of the physical erasing unit 510(F+6).

Thereafter, the memory control circuit unit 104 (or the memory management circuit 302) reads the valid data from the lower physical programming units of the physical erasing unit 510(S+6), writes the read valid data into the lower, center and upper physical programming units of a physical erasing unit 510(F+2) (also referred to a ninth physical erasing unit) of the spare area 502b of the storage area 502 (i.e., this is the operation of "Data merging B" as shown in FIG. 12), and marks the data belonging to the physical erasing unit 510(F+3) and stored in the physical erasing unit 510(S+6) as invalid. Thereafter, the memory control circuit unit 104 (or the memory management circuit 302) maps the logical sub units to which the valid data belongs to the physical programming units of the physical erasing unit 510(F+2). In the example of FIG. 12, the valid data in the physical erasing unit 510(F+6) of the data area 502a is first copied to the physical erasing unit 510(S+6) of the temporary area 504, and then the copied data is copied from the physical erasing unit 510(S+6) to the physical erasing unit 510(F+2) of the spare area 502b. Accordingly, all the data in the physical erasing unit 510(F+6) of the data area 502a become the invalid data, so the physical erasing unit 510(F+6) may be released after the erasing operation is performed thereto (i.e., the physical erasing unit 510(F+6) is associated to the spare area 502b).

Figure 13:
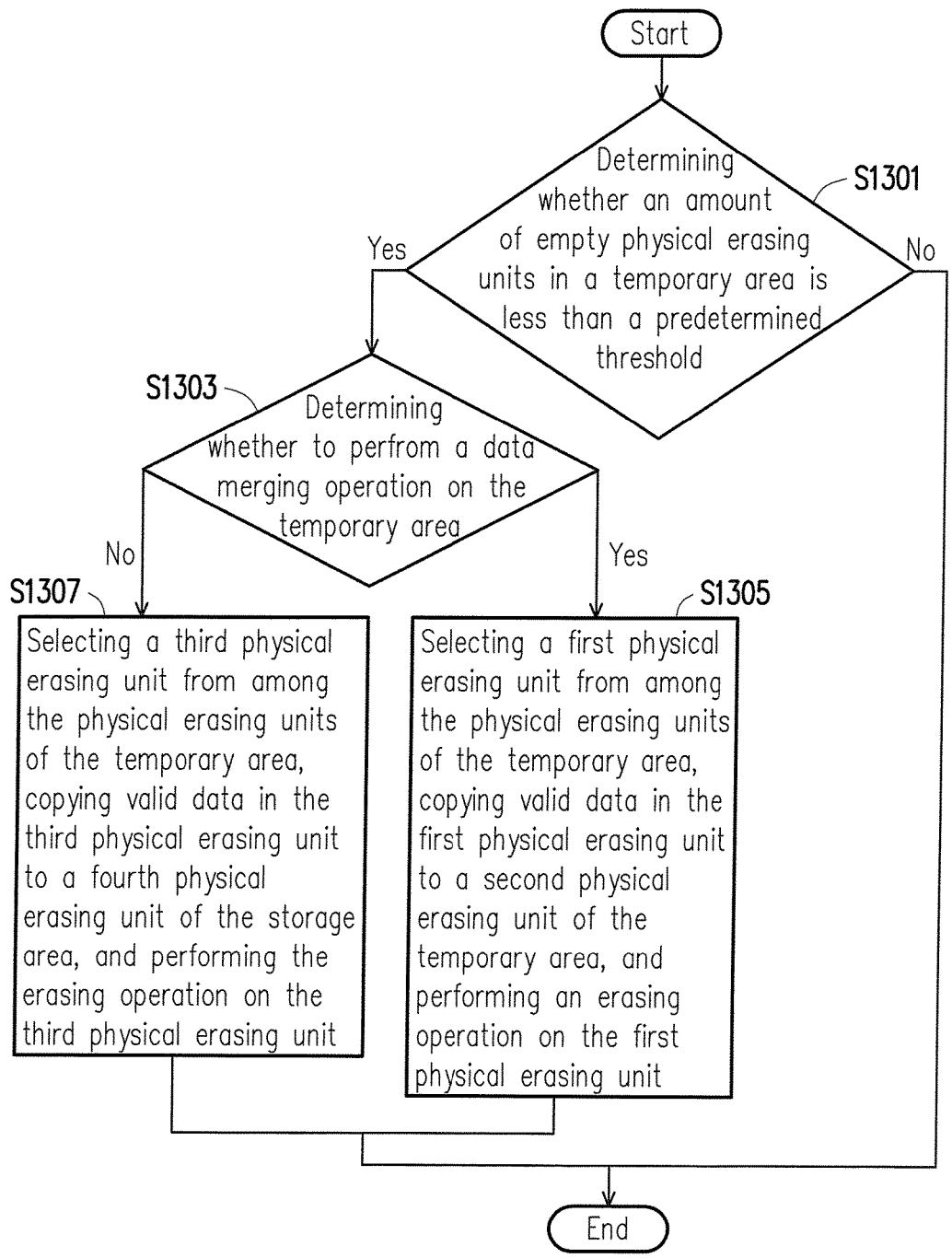
FIG. 13 is a flowchart illustrating the data merging operation according to an exemplary embodiment.

FIG. 13 is a flowchart illustrating the data merging operation according to an exemplary embodiment.

In step S1301, the memory control circuit unit 104 (or the memory management circuit 302) determines whether an amount of empty physical erasing units (also referred to available physical erasing units) in the temporary area 504 is less than a predetermined threshold.

When the amount of the empty physical erasing units of the temporary area 504 is not less than the predetermined threshold, the process of FIG. 13 ends.

When the amount of the empty physical erasing units of the temporary area 504 is less than the predetermined threshold, in step S1303, the memory control circuit unit 104 (or the memory management circuit 302) determines whether to perform a data merging operation within the temporary area 504. For example, the memory control circuit unit 104 (or the memory management circuit 302) determines whether to perform the data merging operation in the temporary area 504 according to the amount of the valid data in the temporary area 504. For example, if the amount of the valid data in the temporary area 504 is less than the predetermined threshold, the memory control circuit unit 104 (or the memory management circuit 302) determines to perform the data merging operation in the temporary area 504.

If it is determined to perform the data merging operation in the temporary area 504, in step S1305, the memory control circuit unit 104 (or the memory management circuit 302) selects a physical erasing unit (hereinafter, also referred to a first physical erasing unit) storing with data from among the physical erasing units of the temporary area 504, copies valid data in the first physical erasing unit to another physical erasing unit (hereinafter, also referred to a second physical erasing unit) of the temporary area 504, and performs an erasing operation on the first physical erasing unit.

If it is determined not to perform the data merging operation in the temporary area 504, in step S1307, the memory control circuit unit 104 (or the memory management circuit 302) selects a physical erasing unit (hereinafter, also referred to a third physical erasing unit) storing with data from among the physical erasing units of the temporary area 504, copies valid data in the third physical erasing unit to another physical erasing unit (hereinafter, also referred to a fourth physical erasing unit) of the storage area 502, and performs the erasing operation on the third physical erasing unit.

It may be understood that steps and a sequence thereof in the FIG. 13 are merely an example and the present invention is not limited thereto. For example, steps S1305 and S1307 may also be performed separately according to different driving signals instead of being performed according to the determinations of step S1301 and step S1303.

In summary, according to the invention, by performing the data merging operation on the physical erasing units within the temporary area and performing the data merging operation for copying valid data from the physical erasing units of the temporary area into the physical erasing units of the storage area, the physical erasing units may be prevented from rapid decline in the operating life caused by the multi-page mode being overly used, so as to improve reliability and access speed of the flash memory having each memory cell capable of storing multiple bits.

It will be apparent to, those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method, for a rewritable non-volatile memory module having a plurality of physical erasing units, each of the physical erasing units having a plurality of physical programming units, and the data writing method comprising:
   at least grouping the physical erasing units into a temporary area and a storage area, wherein the physical erasing units of the temporary area are operated in a single-page mode for writing data and the physical erasing units of the storage area are operated in a multi-page mode for writing data;
   selecting a first physical erasing unit from among the physical erasing units of the temporary area, copying a plurality of valid data in the first physical erasing unit to a second physical erasing unit among the physical erasing units of the temporary area, and performing an erasing operation on the first physical erasing unit;
   selecting a third physical erasing unit from among the physical erasing units of the temporary area, copying a plurality of valid data in the third physical erasing unit to a fourth physical erasing unit among the physical erasing units of the storage area, and performing the erasing operation on the third physical erasing unit;
   selecting a seventh physical erasing unit from among the physical erasing units of the storage area, copying a plurality of valid data in the seventh physical erasing unit to an eighth physical erasing unit among the physical erasing units of the temporary area, performing the erasing operation on the seventh physical erasing unit, and copying, in response to the erasing operation being completed on the seventh physical erasing unit, the valid data previously belonging to the seventh physical erasing unit and currently being stored in the eighth physical erasing unit to a ninth physical erasing unit among the physical erasing units of the storage area.

2. The data writing method of claim 1, further comprising:
   selecting a fifth physical erasing unit from among the physical erasing units of the storage area, copying a plurality of valid data in the fifth physical erasing unit to a sixth physical erasing unit among the physical erasing units of the storage area, and performing the erasing operation on the fifth physical erasing unit.

3. The data writing method of claim 1, wherein the step of selecting the first physical erasing unit from among the physical erasing units of the temporary area comprises:
   identifying at least one hot data from among data temporarily stored in the temporary area, and selecting the first physical erasing unit according to the at least one hot data, wherein the at least one hot data is stored in the first physical erasing unit,
   wherein the step of selecting the third physical erasing unit from among the physical erasing units of the temporary area comprises: identifying at least one cold data from among the data temporarily stored in the temporary area, and selecting the third physical erasing unit according to the at least one cold data, wherein the at least one cold data is stored in the third physical erasing unit.

4. The data writing method of claim 1, further comprising:
   recording a valid data count of each of the physical erasing units of the temporary area according to an amount of the valid data in the physical erasing units of the temporary area,
   wherein the step of selecting the first physical erasing unit from among the physical erasing units of the temporary area comprises:
   selecting the first physical erasing unit according to the valid data counts of the physical erasing units of the temporary area, wherein the valid data count of the first physical erasing unit is less than the valid data counts of other physical erasing units among the physical erasing units of the temporary area.

5. A data writing method, for a rewritable non-volatile memory module having a plurality of physical erasing units, each of the physical erasing units having a plurality of physical programming units, and the data writing method comprising:
   at least grouping the physical erasing units into a temporary area and a storage area, wherein the physical erasing units of the temporary area are operated in a single-page mode for writing data and the physical erasing units of the storage area are operated in a multi-page mode for writing data;
   selecting a first physical erasing unit from among the physical erasing units of the temporary area, copying a plurality of valid data in the first physical erasing unit to a second physical erasing unit among the physical erasing units of the temporary area, and performing an erasing operation on the first physical erasing unit;
   selecting a third physical erasing unit from among the physical erasing units of the temporary area, copying a plurality of valid data in the third physical erasing unit to a fourth physical erasing unit among the physical erasing units of the storage area, and performing the erasing operation on the third physical erasing unit; and
   recording a valid data count of each of the physical erasing units of the temporary area according to an amount of the valid data in the physical erasing units of the temporary area,
   wherein the step of selecting the third physical erasing unit from among the physical erasing units of the temporary area comprises:
   selecting the third physical erasing unit according to the valid data counts of the physical erasing units of the temporary area in response to determining that all the physical erasing units of the temporary area are occupied, wherein the valid data count of the third physical erasing unit is the largest valid data count among the valid data counts of the physical erasing units of the temporary area.

6. A memory storage apparatus, comprising:
a connection interface unit configured to couple to a host system;
a rewritable non-volatile memory module having a plurality of physical erasing units, and each of the physical erasing units having a plurality of physical programming units; and
a memory control circuit unit coupled to the connection interface unit and the rewritable non-volatile memory module, and configured to at least group the physical erasing units into a storage area and a temporary area, wherein the physical erasing units of the temporary area are operated in a single-page mode for writing data and the physical erasing units of the storage area are operated in a multi-page mode for writing data,
wherein the memory control circuit unit is further configured to select a first physical erasing unit from among the physical erasing units of the temporary area, copy a plurality of valid data in the first physical erasing unit to a second physical erasing unit among the physical erasing units of the temporary area, and perform an erasing operation on the first physical erasing unit,
wherein the memory control circuit unit is further configured to select a third physical erasing unit from among the physical erasing units of the temporary area, copy a plurality of valid data in the third physical erasing unit to a fourth physical erasing unit among the physical erasing units of the storage area, and perform the erasing operation on the third physical erasing unit,
wherein the memory control circuit unit is further configured to select a seventh physical erasing unit from among the physical erasing units of the storage area, copy a plurality of valid data in the seventh physical erasing unit to an eighth physical erasing unit among the physical erasing units of the temporary area, perform the erasing operation on the seventh physical erasing unit, and copy, in response to the erasing operation being completed on the seventh physical erasing unit, the valid data previously belonging to the seventh physical erasing unit and currently being stored in the eighth physical erasing unit to a ninth physical erasing unit among the physical erasing units of the storage area.

7. The memory storage apparatus of claim 6, wherein the memory control circuit unit is further configured to select a fifth physical erasing unit from among the physical erasing units of the storage area, copy a plurality of valid data in the fifth physical erasing unit to a sixth physical erasing unit among the physical erasing units of the storage area, and perform the erasing operation on the fifth physical erasing unit.

8. The memory storage apparatus of claim 6, wherein in the operation of selecting the first physical erasing unit from among the physical erasing units of the temporary area, the memory control circuit unit identifies at least one hot data from among data temporarily stored in the temporary area, and selects the first physical erasing unit according to the at least one hot data, wherein the at least one hot data is stored in the first physical erasing unit,
in the operation of selecting the third physical erasing unit from among the physical erasing units of the temporary area, the memory control circuit unit identifies at least one cold data from among the data temporarily stored in the temporary area, and selects the third physical erasing unit according to the at least one cold data, wherein the at least one cold data is stored in the third physical erasing unit.

9. The memory storage apparatus of claim 6,
wherein the memory control circuit unit is further configured to record a valid data count of each of the physical erasing units of the temporary area according to an amount of the valid data in the physical erasing units of the temporary area,
wherein in the operation of selecting the first physical erasing unit from among the physical erasing units of the temporary area, the memory control circuit unit selects the first physical erasing unit according to the valid data counts of the physical erasing units of the temporary area, wherein the valid data count of the first physical erasing unit is less than the valid data counts of other physical erasing units among the physical erasing units of the temporary area.

10. The memory storage apparatus of claim 6,
wherein the memory control circuit unit is further configured to record a valid data count of each of the physical erasing units of the temporary area according to an amount of the valid data in the physical erasing units of the temporary area,
in the operation of selecting the third physical erasing unit from among the physical erasing units of the temporary area, the memory control circuit unit selects the first physical erasing unit according to the valid data counts of the physical erasing units of the temporary area, wherein the valid data count of the third physical erasing unit is not less than the valid data counts of other physical erasing units among the physical erasing units of the temporary area.

* * * * *